(12) United States Patent
Pugliesi-Conti et al.

(10) Patent No.: US 7,900,108 B2
(45) Date of Patent: Mar. 1, 2011

(54) MULTI-CLOCK SYSTEM-ON-CHIP WITH UNIVERSAL CLOCK CONTROL MODULES FOR TRANSITION FAULT TEST AT SPEED MULTI-CORE

(75) Inventors: Paul-Henri Pugliesi-Conti, Hermanville sur Mer (FR); Herv Vincent, Caen (FR)

(73) Assignee: NXP B.V., Eindhoven (NL)

( * ) Notice: Subject to any disclaimer, the term of this patent is extended or adjusted under 35 U.S.C. 154(b) by 187 days.

(21) Appl. No.: 12/439,394

(22) PCT Filed: Aug. 29, 2007

(86) PCT No.: PCT/IB2007/053479
§ 371 (c)(1),
(2), (4) Date: Feb. 27, 2009

(87) PCT Pub. No.: WO2008/026177
PCT Pub. Date: Mar. 6, 2008

(65) Prior Publication Data
US 2010/0011264 A1    Jan. 14, 2010

(30) Foreign Application Priority Data
Aug. 31, 2006   (EP) ..................................... 06300907

(51) Int. Cl.
*G01R 31/28* (2006.01)
(52) U.S. Cl. ......................................... 714/731; 714/744
(58) Field of Classification Search .................. 711/167; 365/201; 710/52; 714/726, 731, 744
See application file for complete search history.

(56) References Cited

U.S. PATENT DOCUMENTS
6,131,173 A  *  10/2000  Meirlevede et al. .......... 714/726
(Continued)

FOREIGN PATENT DOCUMENTS
JP    2000081466    7/1998
(Continued)

OTHER PUBLICATIONS
Raychowdhury, A., et al; "A Novel Delay Fault Testing Methodology Using On-Chip Low-Overhead Delay Measurement Hardware at Strategic Probe Points" Proceeding of the European Test Symposium; IEEE; 2005; 6 Pages.

*Primary Examiner* — David Ton

(57) ABSTRACT

A multi-clock system-on-chip (D) comprises i) a core (CE) comprising asynchronous clock domains provided for exchanging test data therebetween, ii) a clock generator unit (CGU) arranged for delivering primary clock signals (clk1-clko) for at least some of the clock domains, and iii) clock control modules (CC1-CCo), arranged respectively for defining the functional clock signals from the primary clock signals and from control signals (intended for setting the clock control modules (CCi) in a normal mode allowing test data transmission from the corresponding emitter clock domain to at least one receiver clock domain or a shift mode forbidding such a test data transmission). Each clock control module (CCi) is connected to a synchronization means (SM) arranged for switching it from the shift mode to the normal mode, and to a delay means (DM) arranged for putting back the emitter launch edge of a functional clock signal intended for the emitter clock domain when this clock control module (CCi) is set into the normal mode, in order this emitter launch edge be temporally located before each corresponding receiver capture edge of the clock signals intended for the receiver clock domains to which the emitter clock domain must transmit test data.

3 Claims, 2 Drawing Sheets

U.S. PATENT DOCUMENTS

| | | | |
|---|---|---|---|
| 6,604,179 B2 * | 8/2003 | Volk et al. | 711/167 |
| 6,826,100 B2 * | 11/2004 | Ellis et al. | 365/201 |
| 6,877,123 B2 * | 4/2005 | Johnston et al. | 714/731 |
| 6,928,494 B1 * | 8/2005 | Volk et al. | 710/52 |
| 7,240,266 B2 * | 7/2007 | Farmer et al. | 714/731 |
| 7,793,179 B2 * | 9/2010 | Sul | 714/726 |
| 2003/0084390 A1 | 5/2003 | Tamarapalli et al. | |
| 2005/0055615 A1 | 3/2005 | Agashe et al. | |
| 2005/0283696 A1 | 12/2005 | Warren et al. | |

FOREIGN PATENT DOCUMENTS

| | | |
|---|---|---|
| WO | 2004075250 | 9/2004 |
| WO | 2006064300 A | 6/2006 |
| WO | 2006085276 A | 8/2006 |

* cited by examiner

MULTI-CLOCK SYSTEM-ON-CHIP WITH UNIVERSAL CLOCK CONTROL MODULES FOR TRANSITION FAULT TEST AT SPEED MULTI-CORE

The present invention relates to multi-clock systems-on-chip allowing performance of transition fault test at speed.

A multi-clock system-on-chip of the type above mentioned is a component of an electronic equipment which generally comprises i) at least one core (processor or micro-controller or digital IP), comprising at least two asynchronous clock domains provided for exchanging (emitting and/or receiving) test data there between, ii) a clock generator unit arranged for delivering primary clock signals for at least some clock domains, and iii) at least two clock control modules (or blocks), arranged respectively for defining functional clock signals from said primary clock signals and from control signals. Control signals are intended for setting a clock control module in a test normal mode allowing test data transmission from the corresponding emitter clock domain to at least one receiver clock domain or in a shift mode forcing the test clock on the functional clock signals to allow a scan chain shift.

A digital IP ("Intellectual Property") is a logical block comprising a sequential logic (flip-flop/register) and/or a combinatorial logic and intended for implementing at least one function.

As it is known by the man skilled in the art, the clock domains being asynchronous, when a functional clock signal, intended for an "emitter" clock domain, is generated in order the latter transmits test data to one or more "receiver" clock domains, the emitter launch edge of this functional clock signal may be temporally located after the receiver capture edge of the corresponding functional clock signal(s) intended for the receiver clock domain(s). As the emitter launch edge induces the test data emission by the emitter clock domain after the capture edge of the receiver, test data are lost and the transition fault test at speed fails.

Figure 1:
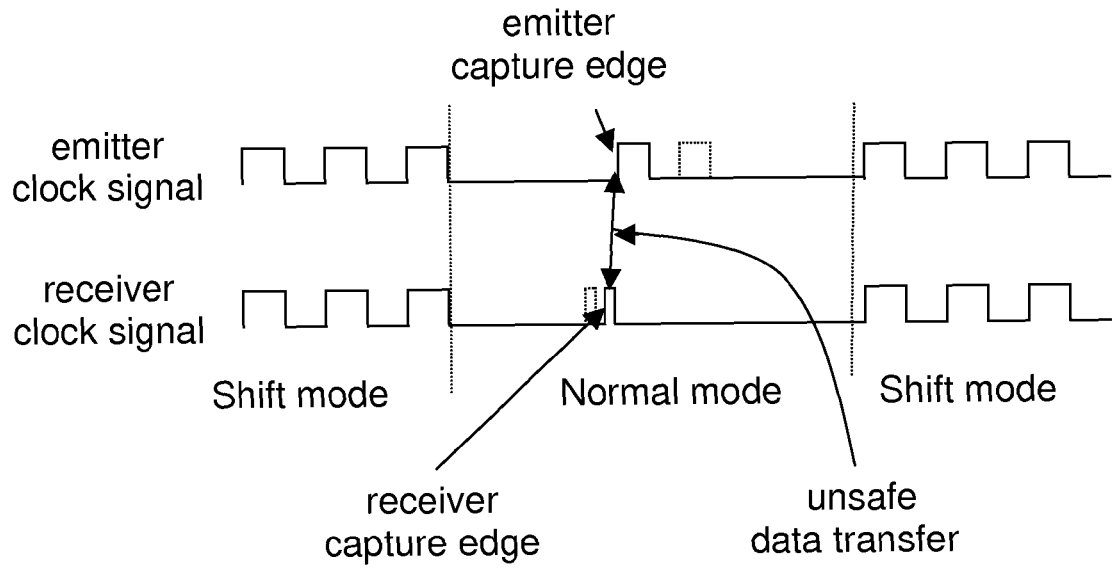

Such a situation is schematically illustrated in FIG. 1. The upper time diagram represents the functional clock signal that is generated by the clock control module associated to the emitter clock domain, while the lower time diagram represents the functional clock signal that is generated by the clock control module associated to the receiver clock domain).

In order to secure the test data transfer between asynchronous clock domains, two solutions are generally used. A first solution consists in adding a dedicated block (or module) to generate synchronous clock signals, with a clock domain alignment, in the core. A second solution consists in adding a dedicated block (or module) to synchronize all clock signals, with a clock domain alignment and a clock synchronizer, in the core. Each of these solutions needs additional development time and effort to be implemented, because the blocks are complex (in term of timing closure and clock tree building) and depend on the multi-clock system-on-chip design. Therefore these solutions have a real cost for a project dedicated to multi-clock system-on-chip conception.

So, the object of this invention is to improve the situation by not adding constraints in the functional clock scheme.

For this purpose, it provides a multi-clock system-on-chip such as the one presented in the introductory part and in which each clock control module (CCi) is connected to:

a synchronisation means arranged for switching its clock control module from the shift mode to the normal mode (and reciprocally), and a delay means for putting back the emitter launch edge of a functional clock signal intended for the emitter clock domain when the clock control module is set into the normal mode (of test), in order this emitter launch edge be temporally located before each corresponding receiver capture edge of the clock signals intended for the receiver clock domain(s) to which the emitter clock domain must transmit test data.

The delay means of this multi-clock system-on-chip may be arranged for putting back the emitter launch edge of a functional clock signal intended for the emitter clock domain with a time duration at least equal to the farthest time distance between this emitter launch edge and the capture edges of the corresponding functional clock signal(s) which is (are) intended for the receiver clock domain(s).

The invention also provides an electronic equipment comprising a multi-clock system-on-chip such as the one above introduced.

Figure 2:
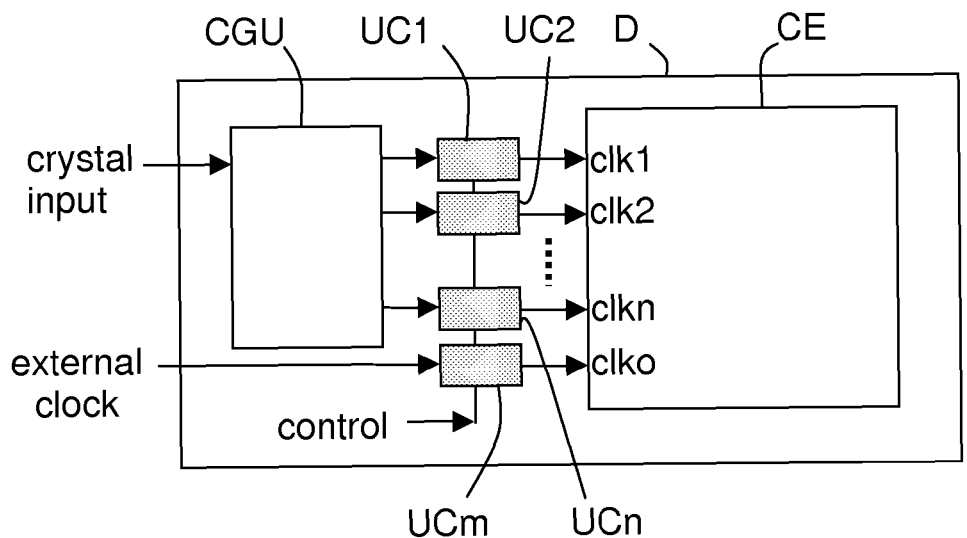
Figure 3:
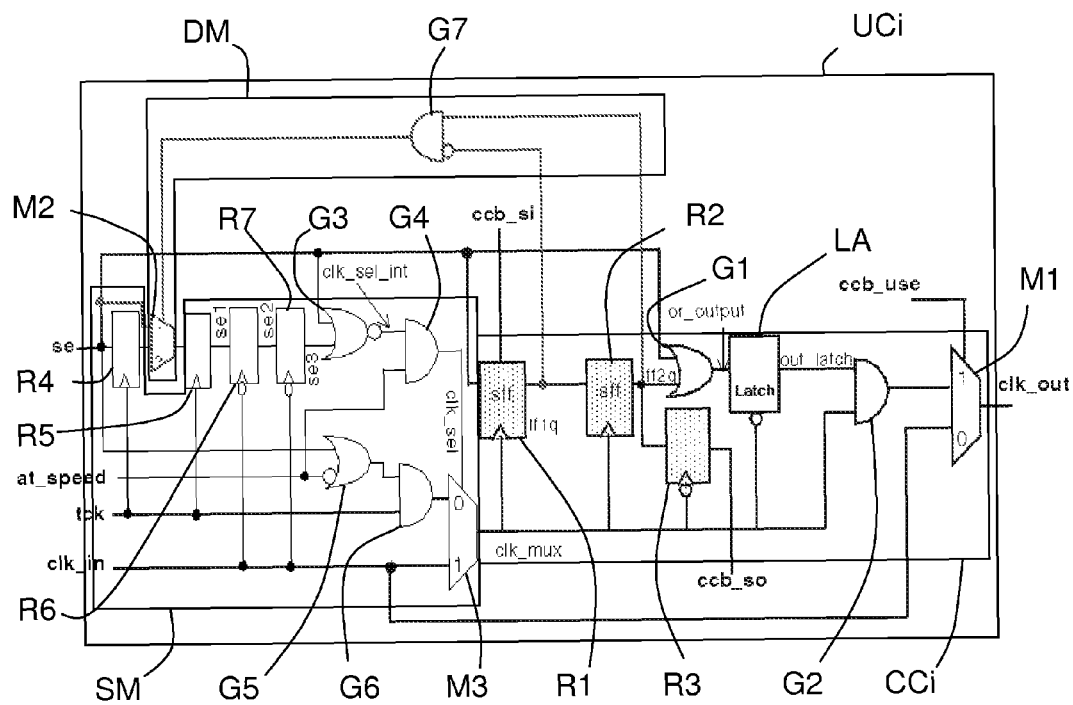
Figure 4:
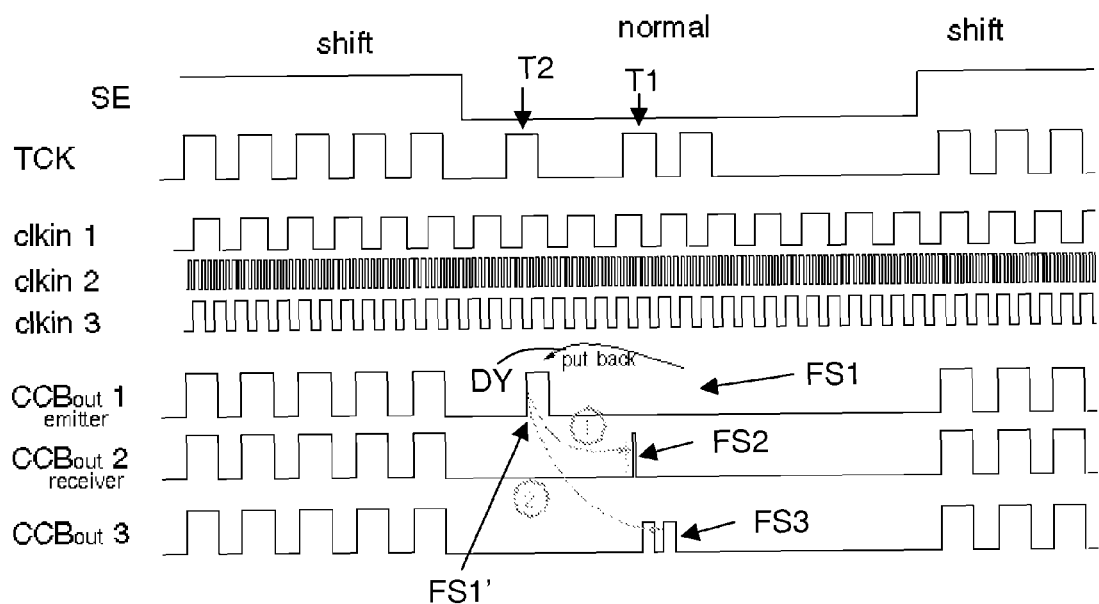

Other features and advantages of the invention will become apparent on examining the detailed specifications hereafter and the appended drawings, wherein:

FIG. 1 schematically illustrates two comparative examples of functional clock signal time diagrams for an emitter clock domain (upper one) and a receiver clock domain (lower one) of a multi-clock system-on-chip of the art, FIG. 2 schematically illustrates an example of embodiment of a multi-clock system-on-chip according to the invention, FIG. 3 schematically illustrates an example of embodiment of a universal clock control module for a multi-clock system-on-chip according to the invention, FIG. 4 schematically illustrates comparative examples of clock signal time diagrams for an emitter clock domain and two receiver clock domains of a multi-clock system-on-chip according to the invention.

The appended drawings may not only serve to complete the invention, but also to contribute to its definition, if need be.

Reference is initially made to FIG. 2 to describe a multi-clock system-on-chip D according to the invention.

In the following description it will be considered, as example, that the multi-clock system-on-chip D equips an electronic equipment, such as a mobile telephone. But, the invention is not limited to this type of electronic equipment (or application). It applies to any type of electronic equipment, adapted or not to (tele)communications, and needing at least one core (i.e. a processor or a micro-controller) to execute programs (or software(s)) or commands. So, it may be also a personal digital assistant (PDA), a computer, possibly of the portable type, a game or audio or video player, a television, or a set-top box, for instance.

Moreover in the following description it will be considered that the multi-clock system-on-chip D comprises only one core, in order to simplify the description of the invention. But, the invention is not limited to a single core system-on-chip. Indeed, it applies to any multi-clock system-on-chip comprising at least one core and capable of performing transition fault test(s). More generally, the invention is limited neither by the number of cores nor by the number of clock domains.

As schematically illustrated in FIG. 2, a multi-clock system-on-chip D according to the invention comprises at least one clock generator unit CGU, at least one core (processor or micro-controller or digital IP) CE, and one universal clock control module (or block) UCi (i=1 to o) per clock domain (internal or external).

The core CE comprises at least two asynchronous clock domains CDi (i=1 to o—not illustrated) provided for exchanging (i.e. emitting and/or receiving) data therebetween.

A clock domain CDi is a group of at least one electronic component, eventually of the logical type, and which is arranged for carrying out operation(s) on digital data according to a specific rate defined by a clock signal clki. In other words, a clock domain CDi is a group of registers clocked on a given clock signal. In normal working (i.e. apart from a transition fault test) the clock of a clock domain CDi is defined by "primary" clock signals (output of the clock generator unit CGU), as an UCCB (CCi+SM+DM) is transparent, while during a transition fault test the clock of a clock domain CDi is defined by the so-called "functional" clock signals, generated by the UCCB.

The clock generator unit CGU is arranged for delivering the primary clock signals for some or the whole clock domains CDi. For this purpose it can be fed by a pulse generator, such as a crystal delivering periodic pulses with a very precise periodicity, from which it defines different clock signals with different frequencies by means of PLLs ("Phased-Locked-Loops").

In the non limiting illustrated example the core CE comprises o clock domains CD1 to CDo respectively fed with o different clock signals clk1 to clko. Amongst these clock signals only the ones labelled from clk1 to clkn descend from the clock generator unit CGU. The last clock signal clko descends from an external clock, independent from the clock generator unit CGU. But this is only an example. The clock generator unit CGU may effectively define primary clock signals for each clock domain CDi.

A launch edge is intended for launching a stimulus on the path under test from the emitter clock domain to the receiver clock domain. A capture edge is intended for capturing the response to the launched stimulus by the receiver clock domain.

Each clock input of the core CE is connected to an universal clock control module (or block) UCi which comprises, as illustrated in FIG. 3, a clock control module CCi, a synchronisation module SM and a delay module DM connected therebetween.

A clock control module CCi is arranged for defining functional clock signals during a transition fault test from primary clock signals and from control signals, or for transferring primary clock signals from the clock generator unit CGU (or an external clock) to the corresponding clock input apart from a transition fault test.

The control signals are intended for setting a clock control module CCi either in a (test) normal mode (which allows test data transmission from the corresponding emitter clock domain CDi to at least one receiver clock domain CDi') during a transition fault test, or in a shift mode forcing the test clock on the functional clock signals to allow a scan chain shift. These control signals are provided by a test control module which is external to the multi-clock system-on-chip D.

A non-limiting example of embodiment of a clock control module CCi is illustrated in FIG. 3. In this example the clock control module CCi comprises:

- a first register R1 comprising a first input for receiving a scan enable signal se intended for controlling setting of shift and normal mode, a second input for receiving a signal ccb_si intended for a clock control module scan chain, a third input for receiving the clock signal clk_mux, and an output ff1$q$,
- a second register R2 comprising a first input connected to the output of the first register R1, a second input for receiving the clock signal clk_mux, and an output ff2$q$,
- a third register R3 comprising a first input connected to the output of the second register R2, a second inverted input for receiving the clock signal clk_mux, and an output ccb_so for the clock control module scan chain output,
- a logical OR gate G1 comprising a first input connected to the output of the second register R2, a second input for receiving the scan enable signal se, and an output for delivering a signal or_output depending on the signals received onto the first and second inputs. This gate G1 is intended for forcing the test clock in shift mode,
- a latch register LA comprising a first input connected to the output of the logical OR gate, a second inverted input for receiving the signal clk_mux, and an output for delivering a signal out_latch. This register LA is intended for avoiding any glitch on the out_latch clock signal,
- a logical AND gate G2 comprising a first input connected to the output of the latch register LA, a second input for receiving the signal clk_mux, and an output for delivering a signal depending on the signals received onto the first and second inputs and defining a functional clock signal. The aim of this gate G2 is to "gate" the clock, and
- a multiplexer M1 comprising a first input connected to the output of the logical AND gate G2, a second input for receiving the primary clock signal clk_in, a third input for receiving a control signal ccb_use intended for bypassing the clock control module CCi, and an output clk_out for delivering either the functional clock signal outputted by the logical AND gate G2 or the primary clock signal clk_in depending on the received control signal ccb_use; this output clk_out feeding the clock input of the corresponding clock domain CDi.

The synchronisation module SM is arranged, when it receives control signals, for switching the clock control module CCi to which it is connected to from the shift mode to the normal mode, and reciprocally.

A non-limiting example of embodiment of a synchronisation module SM is illustrated in FIG. 3. In this example the synchronisation module SM comprises:

- a first register R4 comprising a first input for receiving the scan enable signal se, a second input for receiving a test clock signal tck intended for being used in all scan test mode not at functional frequency, and an output,
- a second register R5 comprising a first input connected to the output of the first register R4 through a multiplexer M3 of the delay module DM, a second input for receiving the test clock signal tck, and an output for delivering a signal se1. The first R4 and second R5 registers are used to re-synchronize the two functional clock pulses on the test clock signal tck: either on two tck pulses when the first register R4 is not bypassed or on one tck pulse when the first register R4 is bypassed (this case occurs when the pulse is put back),
- a third register R6 comprising a first input connected to the output of the second register R4, a second input for receiving the primary clock signal clk_in, and an output se2,
- a fourth register R7 comprising a first input connected to the output of the third register R6, a second input for receiving the primary clock signal clk_in, and an output se3. The third R6 and fourth R7 registers are used to re-synchronize the signal se1 coming from the tck clock domain on the clk_in clock,
- a first logical NOR gate G3 comprising a first input connected to the output se3 of the fourth register R7, a second input for receiving the scan enable signal se, and an output for delivering a signal clk_se1_int depending on the signals received onto the first and second inputs. This gate G3 is intended for switching asynchronously the functional clock on the test clock signal tck at the end of the (test) normal mode, when the scan enable is set back to one, a first logical AND gate G4 comprising a first input connected to the output of the first logical NOR gate G3, a second input for receiving a signal at_speed intended for transition fault mode control, and an output for delivering a control signal clk_se1 depending on the signals received onto the first and second inputs. The signal at_speed allows to enable the synchronization of the scan_enable contained in the synchronisation module SM: when at_speed is low, the test clock signal tck is forced on the clk_mux clock, and the transition fault test is performed at tck, a second logical OR gate G5 comprising a first input for receiving the scan enable signal se, a second inverted input for receiving the signal at_speed, and an output for delivering a signal depending on the signals received onto the first and second inputs, a second logical AND gate G6 comprising a first input connected to the output of the second logical OR gate G5, a second input for receiving the test clock signal tck, and an output for delivering a signal depending on the signals received onto the first and second inputs. These gates G5 and G6 are intended for enabling the test clock signal tck depending on the scan_enable and at_speed signals, and a multiplexer M3 comprising a first input connected to the output of the second logical AND gate G6, a second input for receiving the primary clock signal clk_in, a third input for receiving the control signal clk_se1 outputted by the first logical AND gate G4, and an output for delivering the signal clk_mux. This multiplexer M3 is intended for switching the clk_mux clock between the test clock signal tck and the functional clock during the normal mode.

The delay module DM is provided for putting back the emitter launch edge of each functional clock signal that is intended for the emitter clock domain which corresponds to the clock control module CCi to which it is connected to, when the latter (CCi) is set into the normal mode (which occurs during a transition fault test).

So a delay DY (see FIG. 4) is introduced by the delay module DM in order to compensate for every time shift between the emitter launch edge of a functional clock signal (FS1) intended for the clock domain CDi and the capture edges of the corresponding functional clock signals (FS2, FS3) which are intended for the receiver clock domain CDi' resulting from the lack of synchronicity between the different clock domains.

The value (or time duration) of the delay DY depends therefore from the time distance that would occurs between the emitter launch edge of a functional clock signal (FS1) intended for the clock domain CDi and the capture edge of the corresponding functional clock signal (FS2) which is intended for a receiver clock domain CDi' and which is the farthest from the emitter launch edge, in the absence of delay. More precisely, the value of the delay DY is at least equal to the time distance between the emitter launch edge and the farthest receiver capture edge.

As it is illustrated in FIG. 4, when a chosen delay DY is introduced by the delay module DM, the emitter launch edge of the delayed functional clock signal FS1' is (temporally) located before each corresponding receiver capture edge of the functional clock signal(s) FS2 and FS3 that are intended for the receiver clock domain(s) CD2 and CD3 to which the emitter clock domain CD1 must transmit test data. So, the test data can be safely transferred from the emitter clock domain (here CD1) to the receiver clock domain(s) (here CD2 and CD3).

In the time diagrams illustrated in FIG. 4:

the upper one represents the temporal evolution of a scan enable signal SE (or se) which is used for setting a clock control module CCi in the shift mode or in the normal mode (dedicated to scan test), the following one represents the temporal evolution of the test clock signal TCK (or tck) which is used in all scan test mode not at functional frequency. T1 is the signal which triggers the generation of the capture edge of the functional clock signals FS2 and FS3 that are intended for the receiver clock domains CD2 and CD3, and T2 is the signal which triggers the generation of the emitter launch edge of the delayed functional clock signal FS1' and which is delayed from T1 by the delay DY, the following one represents the temporal evolution of the primary signal clkin 1 generated by the clock generator unit CGU for the first clock domain CD1, the following one represents the temporal evolution of the primary signal clkin 2 generated by the clock generator unit CGU for the second clock domain CD2, the following one represents the temporal evolution of the primary signal clkin 3 generated by the clock generator unit CGU for the third clock domain CD3, the following one represents the temporal evolution of the functional clock signal $CCBout_{emitter}1$ generated by the clock control module CC1, the following one represents the temporal evolution of the functional clock signal $CCBout_{receiver}2$ generated by the clock control module CC2, and the following one represents the temporal evolution of the functional clock signal $CCBout_{receiver}3$ generated by the clock control module CC3.

A non-limiting example of embodiment of a delay module DM is illustrated in FIG. 3. In this example the delay module DM comprises:

a logical AND gate G7 comprising a first inverted input connected to the output ff1$q$ of the first register R1 of the clock control module CCi, a second input connected to the output ff2$q$ of the second register R2 of the clock control module CCi, and an output for delivering a control signal depending on the signals received onto the first and second inputs. This gate G7 is intended for detecting if the clock domain CDi is considered as an emitter, and a multiplexer M2 inserted between the first R4 and second R5 registers of the synchronisation module SM and comprising a first input connected to the output of the first register R4, a second input for receiving the scan enable signal se, a third input for receiving the control signal outputted by the logical AND gate G7, and an output for feeding the first input of the second register R5 either with the signal outputted by the first register R4, or with the scan enable signal se depending on the value of the control signal. This multiplexer M2 allows to bypass the first register R4 when the clock domain CDi is considered as an emitter (in this case the pulse is put back).

As mentioned before a clock control module CCi, a synchronisation module SM and a delay module DM constitute together an UCCB ("Universal Clock Control Block").

The synchronisation module SM manages the clock switch between the test clock signal tck and the functional clock (or primary clock signal) clk_in, at the beginning and at the end of the (test) normal mode, according to the value of the test signals at_speed and scan_enable.

The clock control module CCi is the sequencer which defines the frame of the functional clock (or primary clock signal) clk_in during the (test) normal mode. It allows to define the role of the clock domain CDi as emitter or receiver, according to the values respectively stored in the first R1 and second R2 registers. For instance, if the values 0 and 1 are respectively stored in R1 and R2 the clock domain is emitter, if the values 1 and 0, or 1 and 1, are respectively stored in R1 and R2 the clock domain is receiver, and if the values 0 and 0 are respectively stored in R1 and R2 the clock domain is frozen.

The delay module DM decodes the role of the clock domain CDi and enables or not the bypass of the fourth register R4. In case where the clock domain CDi is an emitter, the fourth register R4 is bypassed and the functional clock pulse (or primary clock signal) clk_in is put back.

The multi-clock system-on-chip D, according to the invention, may be an integrated circuit (IC) realized in CMOS technology or in any technology used in chip industry fabrication. It might also be composed of several integrated circuits (ICs).

The invention is not limited to the embodiments of multi-clock system-on-chip and electronic equipment described above, only as examples, but it encompasses all alternative embodiments which may be considered by one skilled in the art within the scope of the claims hereafter.

The invention claimed is:

1. Multi-clock system-on-chip comprising at least one core comprising at least two asynchronous clock domains provided for exchanging test data there between, a clock generator unit arranged for delivering primary clock signals for at least some of said clock domains, and at least two clock control modules, arranged respectively for defining said functional clock signals from said primary clock signals and from control signals, intended for setting said clock control modules in a normal mode allowing test data transmission from the corresponding clock domain, acting as an emitter, to at least one receiver clock domain or in a shift mode forcing test clock on said functional clock signals to allow a scan chain shift, characterized in that each clock control module is connected to i) a synchronisation means arranged for switching said clock control module from said shift mode to said normal mode, and ii) a delay means arranged for putting back the emitter launch edge of a functional clock signal intended for the emitter clock domain when said clock control module is set into said normal mode, in order said emitter launch edge be temporally located before each corresponding receiver capture edge of the clock signal(s) intended for the receiver clock domain(s) to which said emitter clock domain must transmit test data.

2. Multi-clock system-on-chip according to claim 1, characterized in that said delay means is arranged for putting back the emitter launch edge of a functional clock signal intended for said emitter clock domain with a time duration at least equal to the farthest time distance between said emitter launch edge and the capture edges of the corresponding functional clock signal(s) which are intended for the receiver clock domain(s).

3. Electronic equipment, characterized in that it comprises at least one multi-clock system-on-chip according to claim 1.

* * * * *